United States Patent [19]

Ambruoso, Sr.

[11] 3,938,618

[45] Feb. 17, 1976

[54] SPEAKER GRILLE SCREEN AND MOUNTING STRUCTURE

[75] Inventor: Pasquale Ambruoso, Sr., Coral Springs, Fla.

[73] Assignee: Motorola, Inc., Chicago, Ill.

[22] Filed: Mar. 18, 1975

[21] Appl. No.: 559,618

[52] U.S. Cl. .................... 181/155; 181/149; 29/160

[51] Int. Cl.² ........................................... H05K 5/00

[58] Field of Search ........... 181/148, 149, 155, 151, 181/176; 29/160, 169.5; 179/184, 102, 1 E; 325/352

[56] References Cited

UNITED STATES PATENTS

| | | | |
|---|---|---|---|
| 2,186,276 | 1/1940 | Schwarz et al. | 181/150 |
| 2,829,728 | 4/1958 | Brown | 181/149 |
| 3,065,817 | 11/1962 | Bailey | 181/149 |
| 3,306,990 | 2/1967 | Walker | 181/148 |

*Primary Examiner*—Stephen J. Tomsky

*Attorney, Agent, or Firm*—Donald B. Southard; James W. Gillman

[57] ABSTRACT

A speaker system for a small radio device includes a cover plate having slots therein and a rigid grille screen having channels which extend into the slots. The cover plate and grille screen are generally planar and parallel to each other, and the channels in the screen have portions generally perpendicular to the plate and screen which are spaced from the edges of the slots, with openings therein through which sound is transmitted. A felt disc is positioned over the screen, and the speaker is positioned against the felt disc. An annular bracket engages the speaker rim and is secured to the cover plate to hold the speaker system assembled. The bracket is of semi-circular cross-section with the flat side thereof engaging the speaker, and has integral extensions which are secured to the cover plate to clamp the speaker against the felt disc.

12 Claims, 6 Drawing Figures

SPEAKER GRILLE SCREEN AND MOUNTING STRUCTURE

BACKGROUND OF THE INVENTION

In small portable radio devices, there has been a problem in providing a speaker grille which will permit the passage of sound from within the device and still provide protection so that the speaker or another part of the radio will not be damaged by impact of a sharp object. Such radio devices are subject to being dropped and it is necessary that the protecting screen and supporting structure be strong enough to withstand hard usage.

In order to prevent damage from sharp external objects, it is preferred that there be no open area directly in front of the speaker. However, it is necessary that a path be provided for sound which does not cause a substantial transmission loss. Also, it is desired that the structure for protecting the speaker also provide a mounting for the speaker, and that the components required be simple and inexpensive and be capable of being easily assembled so that the overall cost of the structure is low.

SUMMARY OF THE INVENTION

It is an object of this invention to provide an improved speaker protection and mounting structure for a portable radio device.

Another object of this invention is to provide an improved speaker grille screen which provides effective transmission of sound from a speaker, and which has no openings directly in front of the speaker to permit entry of a foreign object.

A further object of the invention is to provide a cover and grille structure for a speaker including parts made of strong metal to resist entry of a sharp object, and which provides efficient transmission of high frequency speaker components for good intelligibility of reproduced sound.

A still further object of the invention is to provide an improved speaker mounting and front cover system for a radio device which is rugged, which is not susceptible to damage by impact or entry of a sharp object, and which is of simple and inexpensive construction.

Still another object of the invention is to provide a simple speaking mounting structure which is capable of mounting a speaker in one of a plurality of positions with respect to the protecting structure.

The speaker mounting and grille structure of the invention includes a rigid plate, which may be a wall of a radio housing, having slots therein, and a grille screen secured to the plate having channels which extend into the slots of the plate. The housing plate can be formed of a cast metal having substantial strength. The grille screen can be formed of steel which is shaped to provide the channels and punched to provide openings for the passage of sound and for mounting the screen to the plate. The plate and screen are generally planar, and the channels in the screen have portions extending substantially perpendicular to these planes with openings therein for sound passage. Openings are also provided in the screen for receiving projections formed on the plate to rigidly secure the screen to the plate. A felt disc is positioned over the screen, and the rim of a speaker is positioned against the felt disc. The cover plate may have a cast rim for positioning the screen, the disc and the speaker rim, with provisions for receiving the speaker rim in a plurality of positions. An annular bracket is positioned against the back side of the speaker rim to clamp the same against the cover plate, with the screen and felt plate positioned therebetween. The speaker bracket may be of semicircular cross-section, with the edges engaging the speaker rim. The bracket includes integral extensions which are secured to the plate, as by screws threaded into bosses provided on the plate.

DETAILED DESCRIPTION OF THE DRAWINGS

Figure 1:
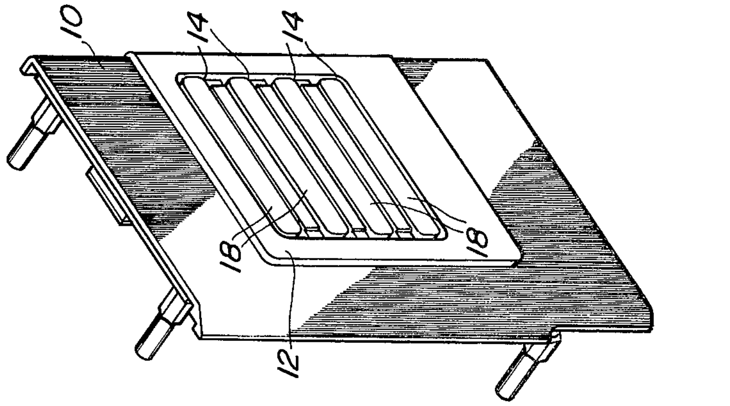
FIG. 1 is a front perspective view of the speaker protection structure of the invention.

FIG. 1 shows the front of the speaker protection structure, which also forms the front housing part for a portable radio transmitter and receiver. This may be a hand-held device which is subject to hard usage. The structure includes a cover plate 10 having a raised portion 12 with elongated open slots 14 formed therein. A grille screen 16 is provided back of the cover plate 10, with projecting channels 18 extending into the slots 14.

Figure 2:
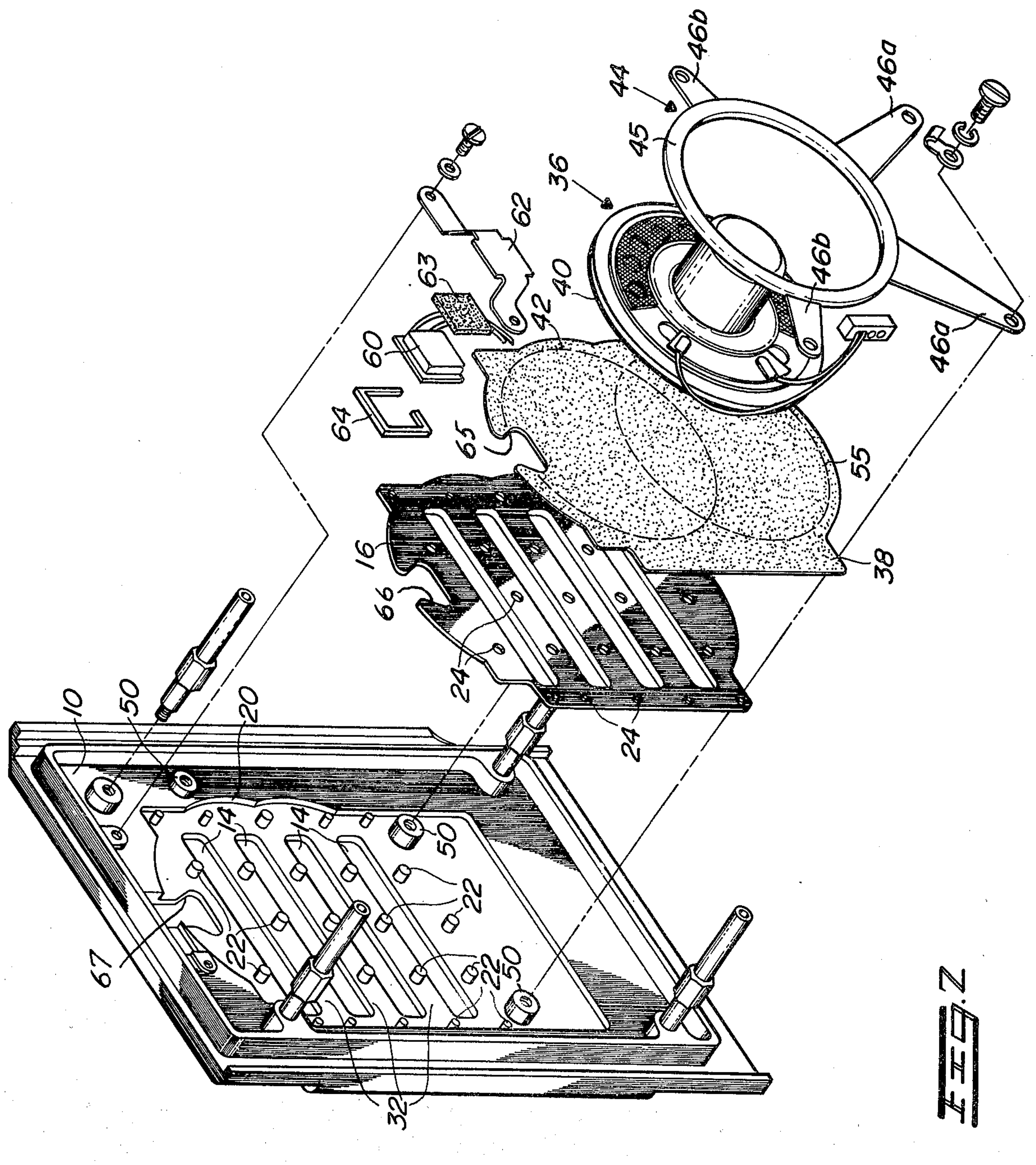
FIG. 2 is an exploded view of the speaker protection and mounting system of the invention.

FIG. 2 shows an exploded view of the speaker protection and mounting structure, and shows the back sides of the cover plate 10 and the grille screen 16. The plate 10 has a rim 20 formed on the back side which serves to accurately position the screen 16. Also, projections 22 on the plate 10 are provided to extend into openings 24 in the screen, to secure the screen to the plate. These projections may have the ends thereof formed over (FIG. 4) to secure the screen to the plate. The cover plate may be cast of metal and the screen may be formed of steel, so that the structure is very strong and rigid and will withstand impacts resulting from hard usage.

Figure 3:
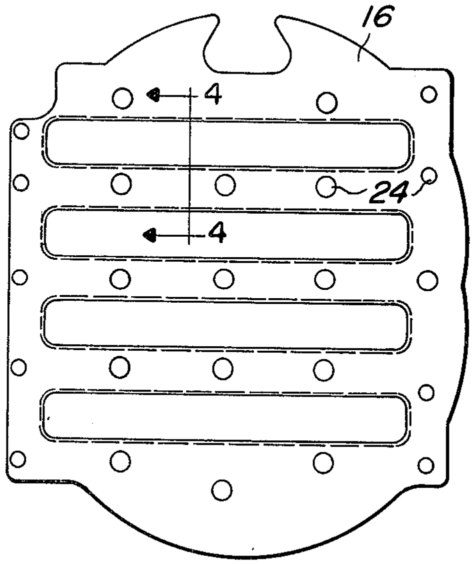
FIGS. 3, 4 and 5 show the construction of the grille screen.
Figure 4:
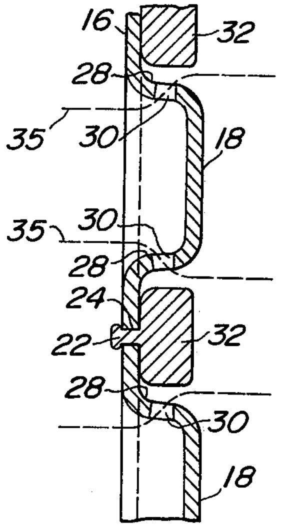
Figure 5:
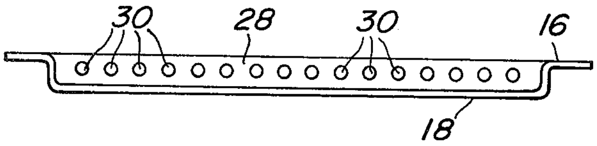

FIGS. 3, 4 and 5 show the screen in more detail. As shown in FIG. 4, the projecting channels 18 of the screen 16 have portions 28 which extend substantially perpendicular to the plane of the screen. These portions 28 have sound transmission apertures or openings 30 therein. These openings are spaced from the strips 32 of the cover plate 10, which extend between the slots 14 therein. The openings 30 are spaced with respect to the strips 32 to provide a tuned cavity in the audio frequency range to accentuate the frequencies providing audio intelligence. The sound therefore passes through the protection structure, passing through the openings 30 and between the channels 18 and the strips 32, as shown by the dotted lines 35 in FIG. 4.

It will be apparent that there are no openings facing the front of the protective structure, so that it is not possible for a foreign object to enter this structure to damage the speaker or sound translating device. This provides very effective protection for the speaker. Since the cover plate and grille screen are both formed of strong metal, and the two parts are securely fastened together, the overall structure is extremely strong and rigid.

FIG. 2 also shows how the speaker 36 is secured to the cover plate 10. A felt disc 38 is positioned over the screen 16, and is shaped to fit within the rim 20 formed on the plate 10. This prevents dust which may enter through the screen 16 from passing to the speaker 36. The speaker has an annular rim 40 which may be positioned against the felt disc 38 at the position shown by the dotted line 42 thereon. The speaker is held against the felt disc 38 by an annular bracket 44 which has extensions 46b integrally formed therewith. The bracket may be clamped to the cover plate 10 by screws 48 which extend through openings in the extensions 46 and are threaded into bosses 50 formed on the cover plate 10. The bracket 44 therefore clamps the speaker 36 against the felt disc 38, which is in turn clamped against the screen 16.

Figure 6:
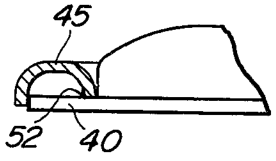
FIG. 6 is a cross-section view of the speaker mounting bracket.

The annular part 45 of the speaker mounting bracket 44 has a semi-circular cross-section, as shown by FIG. 6. This has an edge 52 which bears against the rim 40 of the speaker to provide a firm clamping action all the way around this rim. Accordingly, the speaker is firmly held against the felt 38, and against the screen 16 and plate 10.

The speaker 36 can be positioned against the protective structure in a second position, as shown by the second dotted line 55 on the felt disc 38 (FIG. 2). This may be desired in some devices because other components of the device interfere with the positioning of the speaker on the dotted line 42. A modified bracket can be used to mount the speaker 36 in this second position.

FIG. 2 also shows a microphone 60 which can be mounted to the cover plate 10 when the structure of the invention is used in a radio transmitter and receiver. A bracket 62 engages pad 63 to clamp the microphone 60 against a gasket 64 which engages the plate 10. A slot 65 in the felt disc 38, and a slot 66 in the screen 16, cooperate with a recess 67 formed in the cover plate 10 to permit sound which enters through the protective structure to pass to the microphone 60.

The structure of the invention provides a mounting and protection system for a speaker which is formed of a minimum number of parts, so that it can be provided at low cost. The parts, which include a wall of a radio housing, form a compact structure which is suitable for use in a small radio device, such as a hand-held radio transmitter and receiver. The structure provides highly effective protection for the speaker, being impervious to penetration by sharp objects, and being able to withstand substantial impact forces.

I claim:

1. A protective structure for a sound translating device which provides sound transmission from the device, including in combination:

a plate of high strength material having an opening therein, a rigid grille screen having a projection formed therein which is shaped to extend into said opening, said projection having an aperture therein adjacent an edge of said opening for the passage of sound, and means securing said screen to said plate.

2. The structure of claim 1 wherein said screen is generally of planar shape and extends parallel to said plate, and said projection has a portion extending substantially perpendicular to the plane of said screen and which is spaced from the edge of said opening in said plate, and wherein said aperture in said projection is in said perpendicular portion thereof.

3. The structure of claim 2 wherein said opening in said plate is an elongated slot, and said projection in said screen is an elongated channel formed therein which extends into said slot, and wherein said projection has a plurality of apertures therein.

4. The structure of claim 3 wherein said plate has a plurality of elongated slots therein, and said screen has a plurality of elongated channels therein which extend into said slots, with said apertures being in portions of said channels which extend substantially perpendicular to the plane of said screen.

5. The structure of claim 4 wherein said apertures are in the elongated perpendicularly extending portions of said channels and are spaced from the edges of said slots.

6. The structure of claim 1 wherein said plate has projections extending therefrom, and said screen has openings therein for receiving said projections for securing said screen to said plate.

7. The structure of claim 6 wherein said plate has a rim formed thereon of a shape to receive said screen to facilitate placement of said screen with respect to said plate.

8. The structure of claim 1 further including means to secure a sound translating device to said plate.

9. The structure of claim 8 including a felt disc positioned against said screen adapted to have the sound translating device engaging the same.

10. The structure of claim 8 wherein said means to secure a sound translating device is an annular bracket having a generally semi-circular cross-section with extensions thereon, with an edge of said bracket engaging the sound translating device, and including screws for securing said extensions to said plate.

11. The structure of claim 10 wherein said plate has threaded bosses formed thereon for receiving said screws.

12. The structure of claim 8 wherein said plate has a rim formed thereon which defines a plurality of recesses for positioning a sound translating device with respect thereto.

* * * * *